United States Patent [19]

Fuoco

[11] Patent Number: 5,001,601
[45] Date of Patent: Mar. 19, 1991

[54] MODULAR COOLING FIXTURE FOR POWER TRANSISTORS

[75] Inventor: Francis J. Fuoco, Commack, N.Y.

[73] Assignee: Grumman Aerospace Corporation, Bethpage, N.Y.

[21] Appl. No.: 472,233

[22] Filed: Jan. 30, 1990

[51] Int. Cl.$^5$ .............................................. H05K 7/20
[52] U.S. Cl. .................................... 361/385; 165/80.4; 357/82; 361/382
[58] Field of Search ............................ 165/80.1, 80.4; 174/15.1, 16.3; 357/81, 82; 361/381, 382, 385–388; 363/141, 144

[56] References Cited

U.S. PATENT DOCUMENTS

| | | | |
|---|---|---|---|
| 3,268,771 | 8/1966 | Dortort | 361/386 |
| 3,275,921 | 9/1966 | Fellendorf et al. | 363/141 |
| 4,120,019 | 10/1978 | Arii et al. | 361/381 |

OTHER PUBLICATIONS

Antonetti et al., "Saturated Pad, Liquid Thermal Interface", IBM Technical Disclosure Bulletin, vol. 23, No. 2, 7/1980.

Primary Examiner—Gregory D. Thompson
Attorney, Agent, or Firm—Pollock, VandeSande & Priddy

[57] ABSTRACT

A modular cooling fixture for power transistors include a carrier plate. Transistors are mounted to the plate and insulated transistor leads pass through openings formed in the plate for connection to a printed circuit board. Spacers fasten the board to the carrier plate so that a removable assembly for the transistors is created. A chill plate is juxtaposed in contact with the carrier plate and recesses are formed in the chill plate so that the hat portions of the transistors project into the chill plate, thereby enabling thermal juxtaposed contact between the chill plate and the carrier plate. Passageways are formed through the chill plate to enable the circulation of cooling liquid therethrough. Heat is removed from the transistors by the heat-conductive material of the carrier plate and that heat is then transferred to the chill plate. In the event a transistor or printed circuit becomes faulty, the modular unit including the carrier plate, transistor and printed circuit board may be easily removed and replaced without interrupting the plumbing connections of the chill plate.

6 Claims, 2 Drawing Sheets

MODULAR COOLING FIXTURE FOR POWER TRANSISTORS

FIELD OF THE INVENTION

The present invention relates to cooling apparatus for transistors, and more particularly to a water-cooled mounting for a power transistor which is modular in design.

BACKGROUND OF THE INVENTION

In many industrial applications large capacity power transistors are utilized. This requires the dissipation of heat from the transistors in order to ensure long life and reliable operation. The utilization of heat sinks without employing a cooling fluid is often inadequate.

In the prior art it is common practice to cool high-powered transistors by mounting them on a metallic chill plate. The transistor leads are passed through openings formed through the chill plate and electrical connections are made on the opposite side of the plate. Passageways are formed in the chill plate so that a cooling fluid can be circulated therethrough. Therefore, in effect, the chill plate operates as a radiator.

Since the chill plates are hooked up with fluid supplies to form fixed plumbing fixtures, testing and replacement of defective transistors requires that the transistors must be disconnected from circuit boards from which the transistor leads are connected. If a circuit board has a number of transistors connected to it and it is uncertain as to which transistor is defective, then all of the connections between the circuit board and the transistors must be disconnected to allow removal of the transistors. As will be appreciated, this is a time-consuming and often difficult procedure due to difficulty in obtaining accessibility to the circuit boards.

BRIEF DESCRIPTION OF THE INVENTION

The present invention is an improvement over the prior art chill plates which utilize cooling fluid. The structure of the present invention differs in that the chill plate is modular in design and easily separable from mounted transistors. In order to achieve the objects of the present invention, a chill plate is formed with a number of recesses therein for receiving the head portions of power transistors. The power transistors are then mounted to a metallic carrier plate which is maintained in thermal contact with the chill plate. The carrier plate includes openings formed therein to allow the passage of transistor leads therethrough for connection to a vented circuit board.

In the event that a transistor fails, the transistor carrier plate and mounted transistor as well as the connected printed circuit board are removed as a single assembly. Because there is no mechanical connection between the chill plate and the transistor carrier plate, the separation of the components is done simply and quickly. The placement is equally simple.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
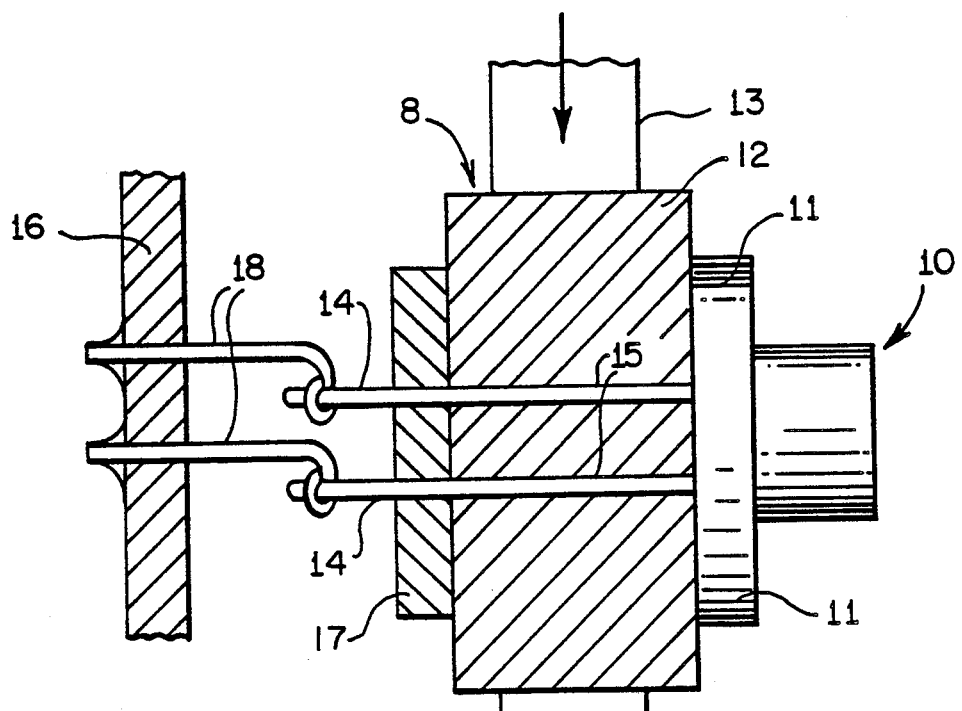
FIG. 1 is a sectional view of a prior art chill plate.

Prior to a detailed description of the present invention, the structure of a conventional chill plate assembly 8 as shown in FIG. 1 will be presented. A power transistor generally indicated by reference numeral 10 includes a shoulder portion 11 which is positioned against a surface of a chill plate 12. The chill plate may be made of copper or aluminum, by way of example. The insulated leads 14 pass through openings 15 formed through the body of the chill plate 12 and then pass through socket 17. The outward end of the leads are then connected to connectors 18 of a printed circuit board 16. In order to cool the temperature of the chill plate, a continuous passageway is formed in the interior of the chill plate body. Water or a chemical coolant is introduced at the inlet 13 and the heated liquid is expelled at outlet 7.

Figure 3:
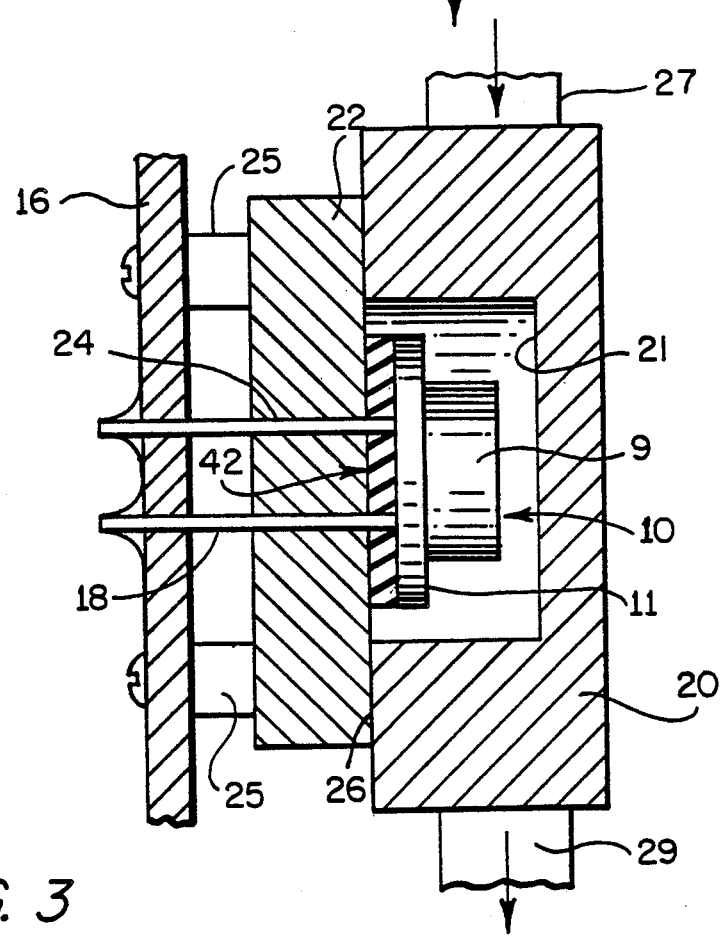
FIG. 3 is a cross-sectional view of the chill plate assembly as employed in the present invention.

FIG. 3 illustrates, in cross section, the novel carrier plate assembly of the present invention. The transistor to be cooled by the chill plate is of the same type as discussed in reference with the prior art of FIG. 1. Again, the transistor is indicated by reference numeral 10 and includes a shoulder 11 stepping down to a hat 9. The shoulder and hat are received within a circular recess 21 formed in the left illustrated surface of the chill plate 20 to a depth sufficient to receive the entire cap and shoulder of the transistor and provide electrical isolation thereto. The coolant inlet 27 and outlet 29 are machined from an original rectangular block resulting in the chill plate 20. By machining the inlet and outlet instead of brazing them on, the chance of rupture is decreased thereby ensuring a greater degree of reliability against leakage. Internal circulatory passageways through the chill plate, between the inlets and outlets are drilled so that the chill plate serves as a heat radiator.

The transistor 10 is actually mounted to a carrier plate 22. More particularly, the shoulder 11 of transistor 10 rests against the left illustrated surface of the carrier plate 22. Openings 24 are formed through the metallic material of the carrier plate so that insulated transistor leads can pass therethrough for connection to a printed circuit board 16.

Figure 2:
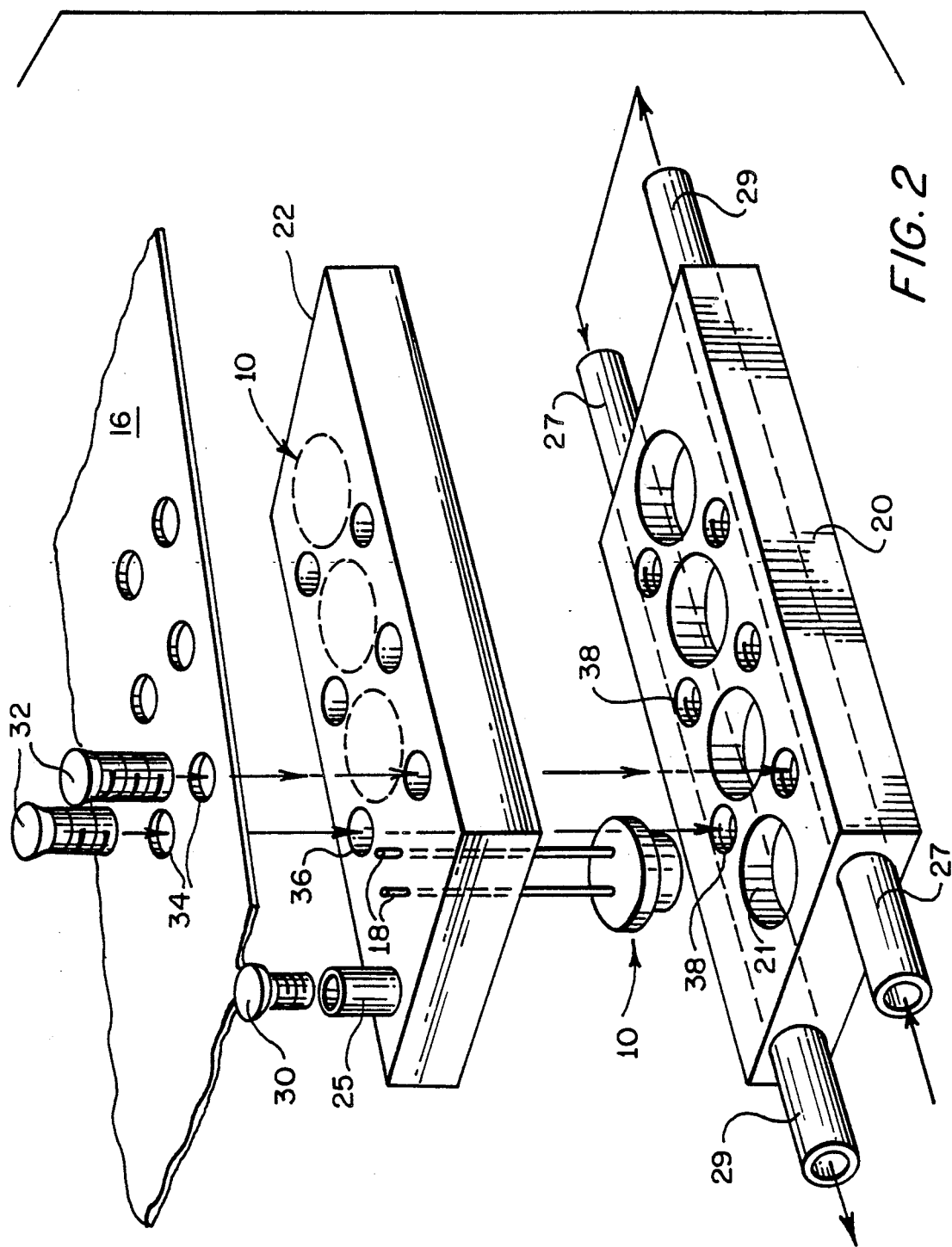
FIG. 2 is a disassembled view of the chill plate in accordance with the present invention.

FIG. 2 illustrates the mounting of several power transistors 10 to a single carrier plate 22, the plurality of transistors to be cooled by a single interfacing chill plate 20. The interconnection between downstream outlet 29 and upstream inlet 27 can be accomplished by means of a suitable metal or high temperature plastic tube (not shown).

By viewing FIG. 2, it will be appreciated that the chill plate 20 is easily separated from the transistor carrier plate 22 since they are maintained in juxtaposed contact by means of screw fasteners 32 which pass through openings 34 in the circuit board 16 and openings 36 in the carrier plate 22. The fasteners then threadingly one can appreciate that the transistor 10 is removed with a complete assembly including carrier plate 22, printed circuit board 16, and stand-off spacers 25. The spacers are held in place by screws 30 passing through circuit board 16. Once a defective transistor is located, its corresponding circuit board is simply removed and another placed into position for regaining contact between transistor carrier plate 22, which conducts heat away from the transistors, to the heat-radiating chill plate 20. In order to create an efficient heat thermal interface 26 between the carrier plate 22 and chill plate 20, the interface is coated with white thermal grease, such as manufactured by the Wakefield Corporation of Massachusetts. A conventional electrical isolator-thermal conductor 42 is positioned between transistor shoulder portion 11 and carrier plate 22.

According to the preceding description of the invention, it will be appreciated that the present structure permits the removal of an electronic assembly without disrupting any coolant plumbing or unsoldering electrical connections between power transistors and a printed circuit board. Accordingly, replacing defective power transistors or printed circuit boards may be easily accomplished.

It should be understood that the invention is not limited to the exact details of construction shown and described herein for obvious modifications will occur to persons skilled in the art.

I claim:

1. A modular cooling fixture for at least one electronic component comprising:
   a printed circuit board secured in spaced relation to the conducting means by stand-off spacers located between the printed circuit board and the conducting means;
   at least one electronic component mounted to the heat-conducting means and electrically connected to the printed circuit board;
   heat radiating means having a recess formed therein for receiving at least one component while contacting the heat-conducting means for permitting heat transfer from the heat-conducting means to the heat-radiating means, the heat-radiating means dissipating the transferred heat thereby keeping at least one component cool;
   means providing circulating liquid to the radiating means;
   wherein at least one component and printed circuit board may be replaced by removal of the heat-conducting means from contact with the heat-radiating means, without disruption of the circulating liquid or disconnection of at least one component from the printed circuit board.

2. The fixture set forth in claim 1 wherein the heat-conducting means comprises a carrier plate having a first surface for contacting at least one component and transferring heat therefrom;
   opening formed in the plate for allowing at least one component leads to pass therethrough for connection to the printed circuit board; and
   wherein the stand-off spacers are removably fixed between the plate and the board allowing removal of the heat-conducting means and the board as a single modular unit upon removal of the spacers.

3. The fixture set forth in claim 1, wherein the heat-radiating means comprises a block of heat-conductive material having a continuous passage formed therein for circulating cooling fluid through the block; and
   wherein the means providing the circulating liquid are inlets and outlets communicating with the continuous passage.

4. The fixture set forth in claim 1 wherein an interface existing between the heat-radiating means and the heat-conducting means includes thermal grease applied thereto for increasing heat transfer therebetween.

5. A modular cooling fixture for power transistors comprising:
   a heat-conducting carrier plate;
   a printed circuit board located in spaced relation to the carrier plate by stand-off spacer means removably fastened between the board and plate creating a removable module;
   a plurality of power transistors mounted to the carrier plate and having their insulated leads pass through the plate for electrical connection to the board, heat being conducted from the transistors to the carrier plate;
   a heat radiating chill plate having spaced recesses provided therein for receiving the hat portion of corresponding transistors, the chill plate and carrier plate being maintained in juxtaposed contact for transferring heat from the carrier plate;
   a continuous passage formed in the chill plate for circulating cooling liquid therethrough; and
   inlet and outlet connections provided from the chill plate body to continuously supply cooled liquid to the chill plate.

6. The fixture set forth in claim 5 wherein an interface existing between the heat-radiating means and the heat-conducting means includes thermal grease applied thereto for increasing heat transfer therebetween.

* * * * *

UNITED STATES PATENT AND TRADEMARK OFFICE
CERTIFICATE OF CORRECTION

PATENT NO. : 5,001,601
DATED : March 19, 1991
INVENTOR(S) : Francis J. Fuoco

It is certified that error appears in the above-identified patent and that said Letters Patent is hereby corrected as shown below:

Column 2, line 60, before "one" insert --engage openings 38 in chill plate 20. By viewing FIG. 3--

Column 3, between lines 22 and 23, insert --heat conducting means;--

Column 4, line 3, change "opening" to --openings--.

Signed and Sealed this

Tenth Day of November, 1992

Attest:

DOUGLAS B. COMER

*Attesting Officer*   *Acting Commissioner of Patents and Trademarks*